United States Patent
Chen et al.

(10) Patent No.: US 11,892,703 B2
(45) Date of Patent: Feb. 6, 2024

(54) HAPTIC FEEDBACK SYSTEM

(71) Applicant: TDK TAIWAN CORP., Taoyuan (TW)

(72) Inventors: Yi-Ho Chen, Taoyuan (TW); Ying-Jen Wang, Taoyuan (TW); Ya-Hsiu Wu, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 225 days.

(21) Appl. No.: 17/459,237

(22) Filed: Aug. 27, 2021

(65) Prior Publication Data
US 2022/0066562 A1   Mar. 3, 2022

Related U.S. Application Data

(60) Provisional application No. 63/071,550, filed on Aug. 28, 2020.

(51) Int. Cl.
*G02B 7/04* (2021.01)
*G02B 7/02* (2021.01)
(Continued)

(52) U.S. Cl.
CPC .......... *G02B 7/04* (2013.01); *G01L 1/16* (2013.01); *G02B 7/003* (2013.01); *G02B 7/02* (2013.01); *G02B 7/09* (2013.01); *G02B 7/1821* (2013.01); *G02B 13/001* (2013.01); *G02B 26/0816* (2013.01); *G02B 26/0875* (2013.01); *G02B 27/0006* (2013.01); *G02B 27/646* (2013.01); *G03B 5/00* (2013.01); *G03B 17/12* (2013.01); *G06F 3/016* (2013.01); *H02K 41/0354* (2013.01); *H03K 17/964* (2013.01);
(Continued)

(58) Field of Classification Search
CPC .......... H10N 30/302; H10N 50/10; G03B 2205/0069; G03B 3/10; G03B 30/00; G03B 13/36; G03B 5/00; G03B 5/02; G03B 17/12; H02K 41/0356; H02K 41/0354; H03K 2217/96062; H03K 17/9517; H03K 17/964; G02B 7/021; G02B 7/04; G02B 7/003; G02B 7/02; G02B 7/09; G02B 7/1821; G02B 13/001; G02B 26/0816; G02B 26/0875; G02B 27/0006; G02B 27/646; G01L 1/16; G06F 3/016; H04N 23/54; H04N 23/55; H04N 23/685
See application file for complete search history.

(56) References Cited

U.S. PATENT DOCUMENTS

| | | | |
|---|---|---|---|
| 10,088,913 B1 * | 10/2018 | Olsson | G06F 3/0202 |
| 2011/0074560 A1 * | 3/2011 | Pfau | H04M 1/23 340/407.2 |
| 2015/0241025 A1 * | 8/2015 | Steiner | H01H 13/83 362/23.05 |

FOREIGN PATENT DOCUMENTS

| | | | | |
|---|---|---|---|---|
| AU | 2013260186 A1 * | 12/2014 | | G06F 3/016 |
| CA | 2937756 C * | 11/2019 | | G01N 29/09 |

* cited by examiner

*Primary Examiner* — Quan Zhen Wang
*Assistant Examiner* — Mancil Littlejohn, Jr.
(74) *Attorney, Agent, or Firm* — Muncy, Geissler, Olds & Lowe, P.C.

(57) ABSTRACT

A haptic feedback system is provided, including a sensing unit, a haptic feedback module, and a circuit assembly. The sensing unit is configured to detect contact with an object. The haptic feedback module is configured to transfer the contact force to the sensing unit. The circuit assembly is electrically connected to the sensing unit and the haptic feedback module.

17 Claims, 16 Drawing Sheets

(51) Int. Cl.
  *G02B 27/64* (2006.01)
  *G02B 13/00* (2006.01)
  *G02B 26/08* (2006.01)
  *G02B 7/00* (2021.01)
  *G01L 1/16* (2006.01)
  *G06F 3/01* (2006.01)
  *H03K 17/96* (2006.01)
  *G03B 5/00* (2021.01)
  *G03B 17/12* (2021.01)
  *H02K 41/035* (2006.01)
  *G02B 7/09* (2021.01)
  *G02B 27/00* (2006.01)
  *H04N 23/55* (2023.01)
  *H04N 23/68* (2023.01)
  *H10N 30/30* (2023.01)
  *G02B 7/182* (2021.01)

(52) U.S. Cl.
  CPC ........... *H04N 23/55* (2023.01); *H04N 23/685* (2023.01); *H10N 30/302* (2023.02); *G03B 2205/0069* (2013.01); *H02K 41/0356* (2013.01); *H03K 2217/96062* (2013.01)

HAPTIC FEEDBACK SYSTEM

CROSS REFERENCE TO RELATED APPLICATIONS

This application claims priority of provisional U.S. Patent Application Ser. No. 63/071,550, filed on Aug. 28, 2020, the entirety of which is incorporated by reference herein.

BACKGROUND OF THE INVENTION

Field of the Invention

The application relates in general to a haptic feedback system, and in particular, to a haptic feedback system that is disposed on an electronic device.

Description of the Related Art

In recent years, as technology has advanced, electronic devices such as mobile phones, tablet computers, notebook computers, and smartphones have become more commonplace, and have been developed to be more convenient, multi-functional and exquisite. More and more choices are provided for users to choose from.

An electronic device usually includes buttons on a housing to allow to the user to control the power or volume, for example. However, when the user presses the button, he or she often cannot tell whether or not the button has been pressed deeply enough to activate its function.

BRIEF SUMMARY OF INVENTION

To address the deficiencies of conventional products, an embodiment of the invention provides a haptic feedback system. The haptic feedback system includes a sensing unit, a haptic feedback module, and a circuit assembly. The sensing unit is configured to detect contact with an object. The haptic feedback module is configured to transfer a contact force to the sensing unit. The circuit assembly is electrically connected to the sensing unit and the haptic feedback module.

In some embodiments, the haptic feedback module includes a fixed part, a movable part, and a driving mechanism. The movable part is movably connected to the fixed part. The driving mechanism is electrically connected to the circuit assembly for driving the movable part to move relative to the fixed part. The sensing unit transmits a sensing signal to the circuit assembly, and the circuit assembly transmits a driving signal to the driving mechanism according to the sensing signal, whereby the movable part is driven to move relative to the fixed part and contacts the sensing unit.

In some embodiments, the fixed part has an opening, and when the movable part is driven to move relative to the fixed part, the movable part extends through the opening and contacts the sensing unit.

In some embodiments, the fixed part includes a housing and a base connected to the housing. The housing has a top portion and at least a sidewall connected to the top portion, wherein the opening is formed on the top portion, and the movable part is disposed between the housing and the base. The movable part has at least a stopper protruding toward the housing, and when the movable part moves relative to the fixed part to a limit position, the stopper contacts the top portion to restrict the movable part in the limit position.

In some embodiments, the top portion is located between the stopper and the sensing unit.

In some embodiments, the sensing unit is affixed to the top portion.

In some embodiments, the sensing unit has a pressure sensor, and when the pressure sensor detects that the pressure exerted by the object exceeds a threshold, the circuit assembly transmits the driving signal to the driving mechanism, whereby the movable part is driven to move relative to the fixed part and contacts the sensing unit.

In some embodiments, the sensing unit has a piezo switch, and when the piezo switch is activated by the object, the circuit assembly transmits the driving signal to the driving mechanism, whereby the movable part is driven to move relative to the fixed part and contacts the sensing unit.

In some embodiments, the sensing unit has a fingerprint sensor, and when a user's identity is confirmed by the fingerprint sensor detecting the object, the circuit assembly transmits the driving signal to the driving mechanism, whereby the movable part is driven to move relative to the fixed part and contacts the sensing unit.

In some embodiments, the fingerprint sensor is a capacitive fingerprint sensor.

In some embodiments, the movable part is driven by the driving mechanism to move relative to the fixed part and generates a vibration signal to the sensing unit.

In some embodiments, the movable part has an upper protrusion, and when the movable part is driven to move relative to the fixed part, the upper protrusion extends through the opening and contacts the sensing unit.

In some embodiments, the haptic feedback system further includes a bottom plate disposed below the circuit assembly, wherein the circuit assembly includes a circuit board and a processor disposed on the circuit board, and the circuit board has a hole, wherein the movable part extends through the hole and contacts the bottom plate when the movable part is driven to move relative to the fixed part.

In some embodiments, the movable part has a lower protrusion, and when the movable part is driven to move relative to the fixed part, the lower protrusion extends through the hole and contacts the bottom plate.

In some embodiments, the haptic feedback module further includes a magnet and a magnetic field sensor, the magnet is disposed on the movable part, and the magnetic field sensor is disposed on the fixed part to detect the magnet.

In some embodiments, the sensing unit includes a protective element, a sensing element, and a circuit element electrically connecting the sensing element to the circuit assembly, wherein the sensing element is disposed between the protective element and the circuit element.

In some embodiments, the driving mechanism has a shape memory alloy element that is electrically connected to the circuit assembly, and the movable part is movably connected to the fixed part via the shape memory alloy element.

In some embodiments, the movable part has a hook, and the shape memory alloy element extends through the hook.

In some embodiments, the driving mechanism has a piezoelectric element that is electrically connected to circuit assembly, and the movable part is movably connected to the fixed part via the piezoelectric element.

In some embodiments, the piezoelectric element extends through the movable part.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the haptic feedback system are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted by an idealized or overly formal manner unless defined otherwise.

Figure 1:
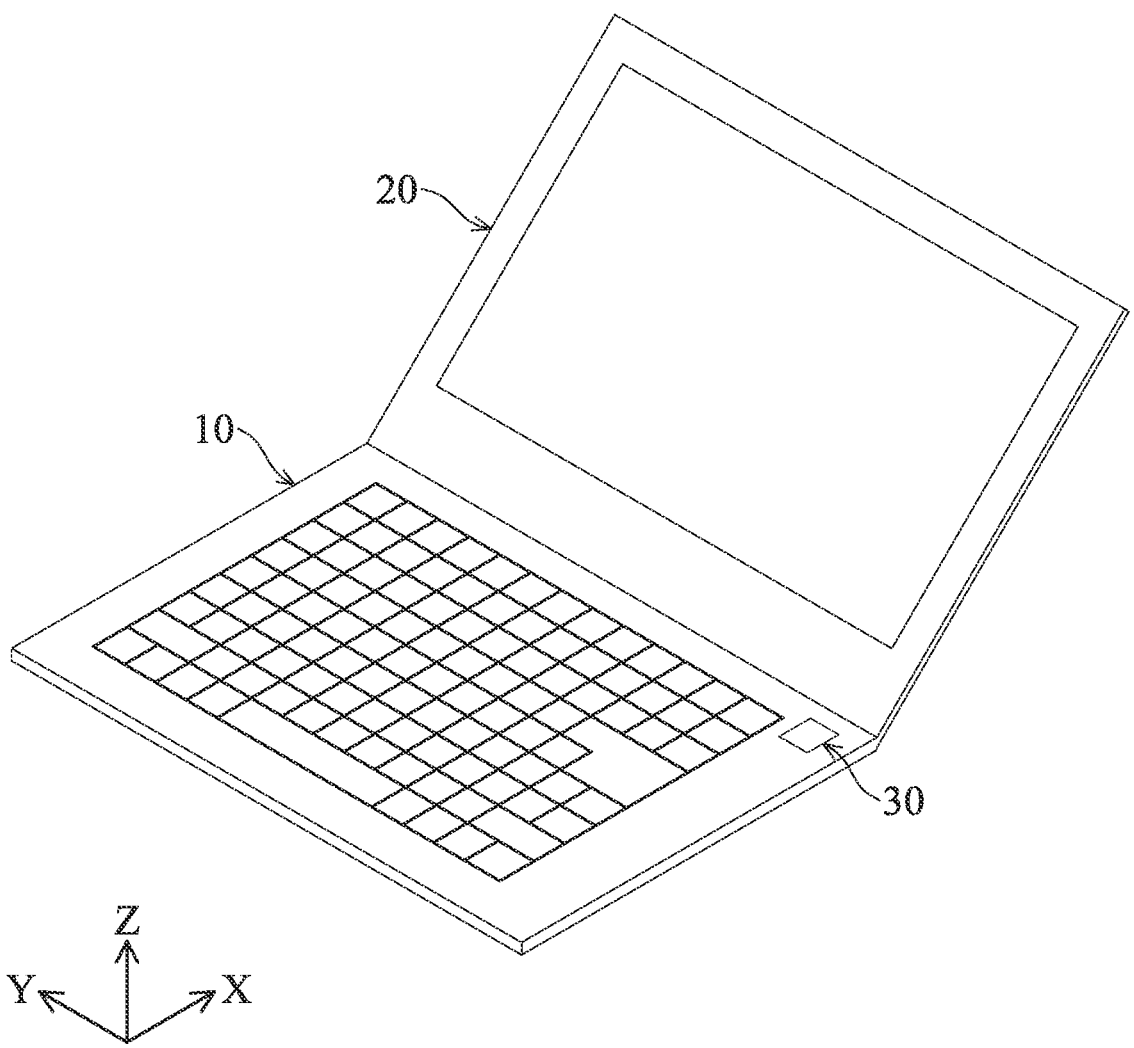
FIG. 1 is a perspective diagram of an electronic device 100 in accordance with an embodiment of the invention.
Figure 2:
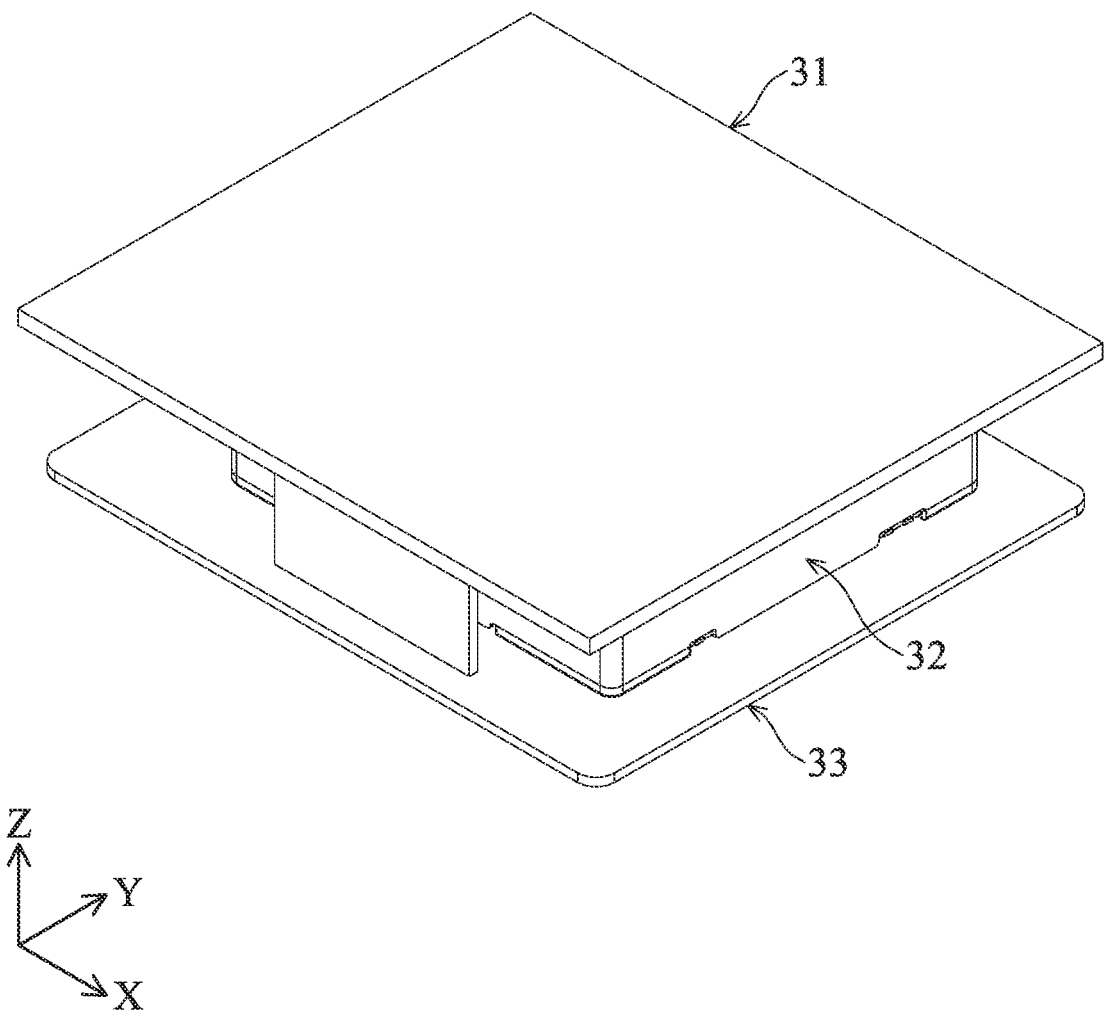
FIG. 2 is a perspective diagram of the haptic feedback system 30 in FIG. 1.
Figure 3:
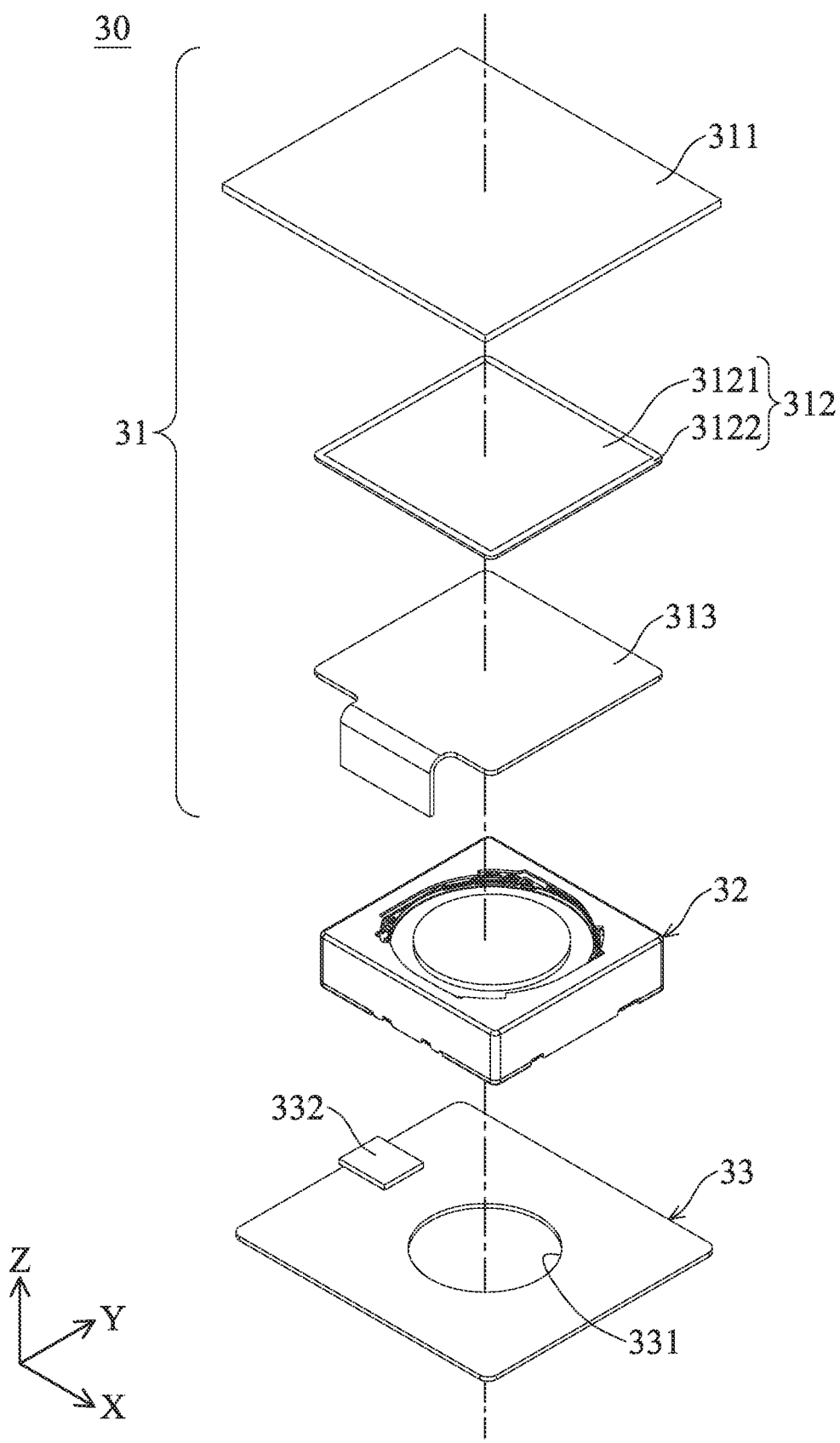
FIG. 3 is an exploded diagram of the haptic feedback system 30 in FIG. 2.

FIG. 1 is a perspective diagram of an electronic device 100 in accordance with an embodiment of the invention. FIG. 2 is a perspective diagram of the haptic feedback system 30 in FIG. 1. FIG. 3 is an exploded diagram of the haptic feedback system 30 in FIG. 2.

Referring to FIGS. 1, 2, and 3, the electronic device 100 in this embodiment may be a laptop computer that includes a main body 10, a display 20, and a haptic feedback system 30. The display 20 is pivotally connected to the main body 10, and the haptic feedback system 30 is disposed on the main body 10.

The haptic feedback system 30 can be used as a power switch of the electronic device 100. When the user touches or presses the haptic feedback system 30 with his or her finger, the haptic feedback system 30 can generate a vibration signal (e.g. sine wave vibration signal) to perform haptic feedback.

The haptic feedback system 30 primarily comprises a sensing unit 31, a haptic feedback module 32, and a circuit assembly 33 arranged in the Z direction. The sensing unit 31 is configured to detect a touch of an object (e.g. the user's finger), and the haptic feedback module 32 can transfer a contact force to the sensing unit 31 to perform haptic feedback. The circuit assembly 33 includes a circuit board 331 and a processor 332 disposed on the circuit board 331. The processor 332 is electrically connected to the sensing unit 31 and the haptic feedback module 32 via the circuit board 331.

As shown in FIG. 3, the sensing unit 31 includes a protective element 311, a sensing element 312, and a circuit element 313. The sensing element 312 is disposed between the protective element 311 and the circuit element 313. In some embodiments the circuit element 313 may comprise a flexible printed circuit (FPC) that is disposed below the sensing element 312 and electrically connected to the sensing element 312 and the circuit board 331.

The sensing element 312 comprises a capacitive fingerprint sensor 3121 and a rim 3122 surrounding the capacitive fingerprint sensor 3121. The protective element 311 may comprise a glass substrate.

To turn on the electronic device 10, the user can put his or her finger on the protective element 311 of the sensing unit 31, and the capacitive fingerprint sensor 3121 can perform fingerprint recognition to confirm the user's identity. When the user's identity is confirmed by the capacitive fingerprint sensor 3121, the capacitive fingerprint sensor 3121 transmits a sensing signal to the processor 332 on the circuit board 331 via the circuit element 313. Subsequently, the processor 332 transmits a driving signal to a driving mechanism in the haptic feedback module 32 according to the sensing signal, whereby a movable part in the haptic feedback module 32 is driven to move upwardly and contact the circuit element 313 of the sensing unit 31. Hence, a contact force can be transferred to the sensing unit 31 so that the user feels the haptic feedback.

Figure 4:
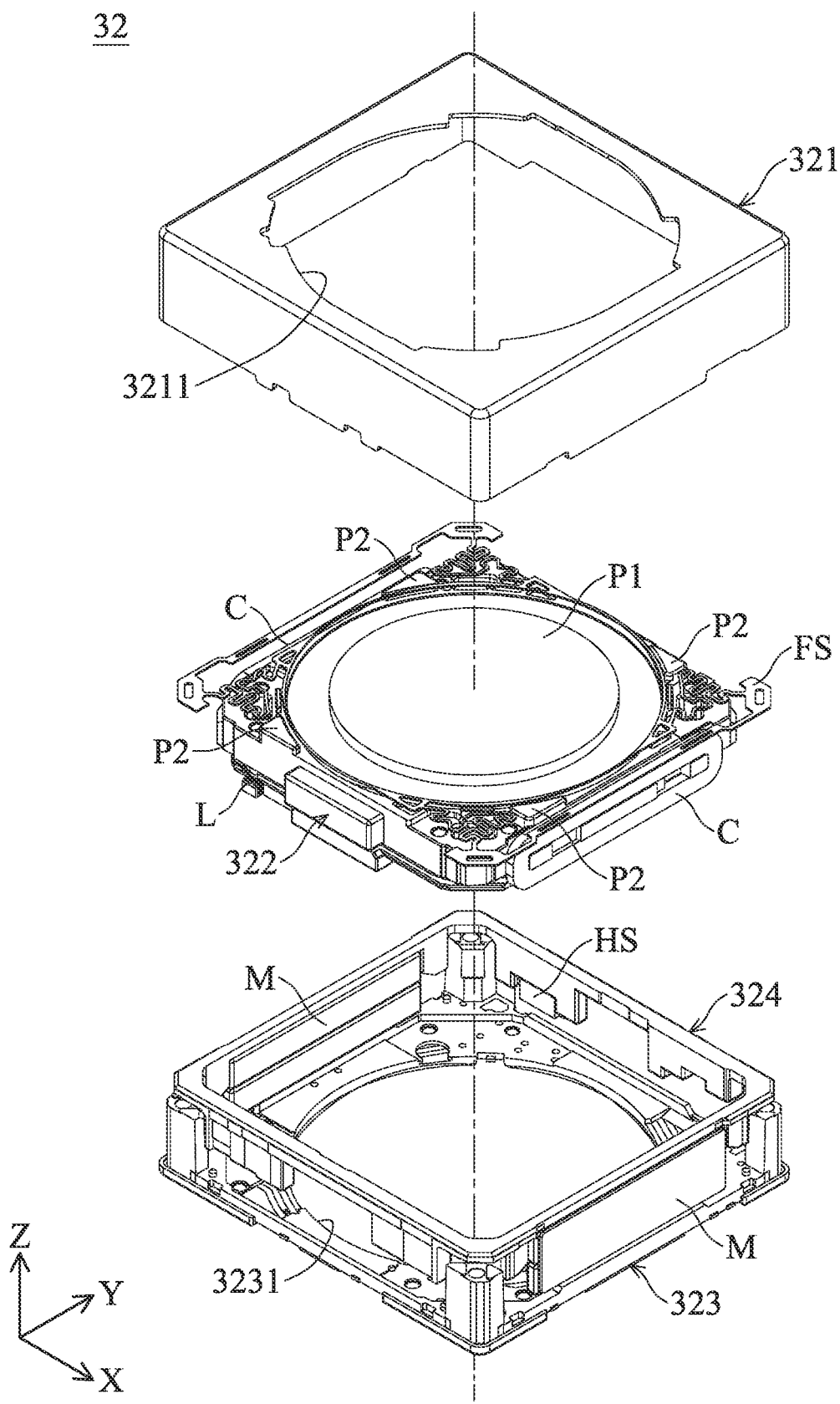
FIG. 4 is an exploded diagram of the haptic feedback module 32 in FIG. 3.
Figure 5:
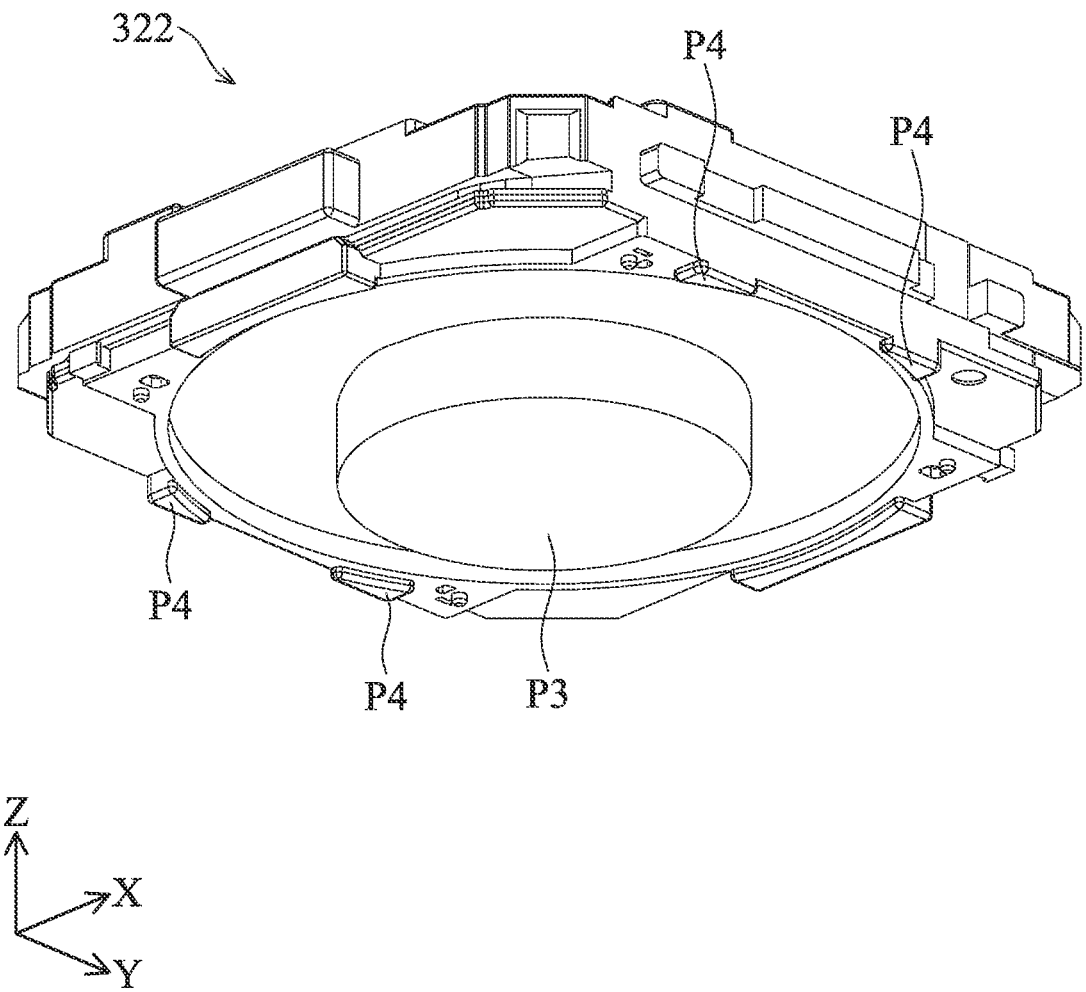
FIG. 5 is a perspective diagram of the movable part 322 in FIG. 4.
Figure 6:
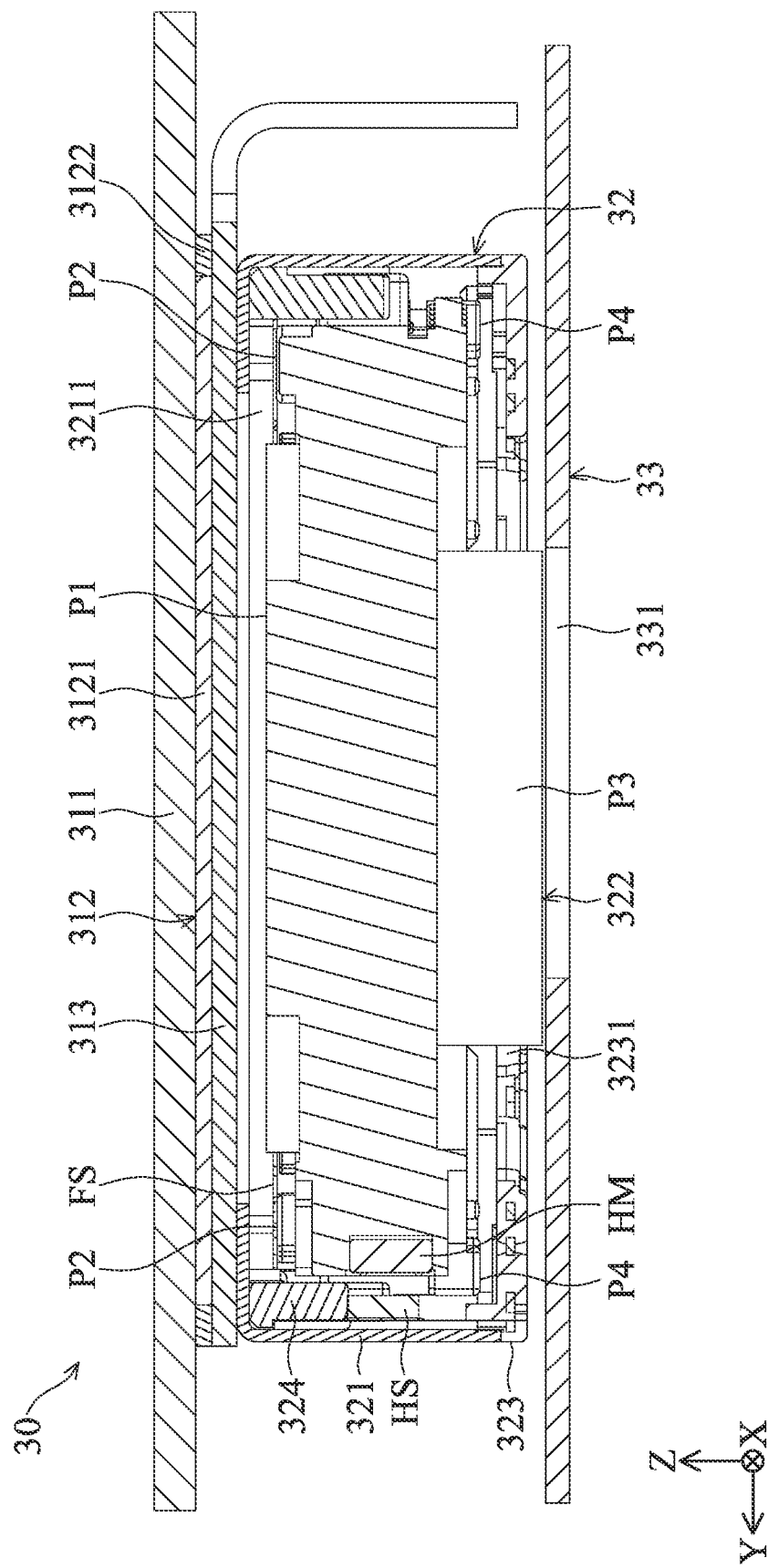
FIG. 6 is a cross-sectional view of the haptic feedback system 30 in FIG. 2.

FIG. 4 is an exploded diagram of the haptic feedback module 32 in FIG. 3. FIG. 5 is a perspective diagram of the movable part 322 in FIG. 4. FIG. 6 is a cross-sectional view of the haptic feedback system 30 in FIG. 2.

Referring to FIGS. 4 and 5, the haptic feedback module 32 primarily comprises a housing 321, a movable part 322, a base 323, and a frame 324. The housing 321 and the base 323 are affixed to each other to constitute a fixed part of the haptic feedback module 32. The movable part 322 is movably received in a space between the housing 321 and the base 323. Here, the movable part 322 is connected to the housing 321 via a sheet spring FS, so that the movable part 322 can move relative to the fixed part (the housing 321 and the base 323) along the Z axis.

The frame 324 is disposed on the base 323, and at least a magnetic element M (e.g. magnet) is mounted between the base 323 and the frame 324. Moreover, at least a coil C is disposed on the movable part 322 and located corresponding to the magnetic element M. The coil C is electrically connected to a metal pin on the base 323 via the conductive terminal L or wires, and the metal pin is electrically connected to the circuit board 311 below the haptic feedback module 32.

When a current signal is applied to the coil C, the driving mechanism (including the coil C and the magnetic element M) generates an electromagnetic force that drives the movable part 322 to move relative to the fixed part along the Z axis. Specifically, the housing 321 has an opening 3211, and the base 323 has a hole 3231. When the movable part 322 is driven to move upwardly relative to the fixed part, the movable part 322 extends through the opening 3211 and contacts the circuit element 313 of the sensing unit 31, whereby a contact force can be transferred to the sensing unit 31 to perform haptic feedback.

Moreover, when the movable part 322 is driven to move downwardly relative to the fixed part, the movable part 322 extends through the hole 3231 and contacts the bottom plate (not shown) that is below the base 323, whereby a vibration signal can be generated to enhance the haptic feedback effect.

As shown in FIGS. 4, 5, and 6, an upper protrusion P1 and at least a stopper P2 are formed on the top side of the movable part 322, and a lower protrusion P3 and at least a stopper P4 are formed on the bottom side of the movable part 322.

The housing 321 has a top portion (perpendicular to the Z axis) and at least a sidewall (parallel to the Z axis) connected to the top portion, wherein the opening 3211 is formed on the top portion. When the movable part 322 is driven to move upwardly relative to the fixed part, the upper protrusion P1 extends through the opening 3211 of the housing 321 and contacts the circuit element 313 of the sensing unit 31. However, when the movable part 322 moves upwardly to a limit position relative to the fixed part, the stoppers P2 contact the top portion of the housing 321 to restrict the movable part 322 in the limit position, whereby the structural damages due to the impact between the upper protrusion P1 and the circuit element 313 of the sensing unit 31 can be prevented.

In this embodiment, the sensing unit 31 can be affixed to the top portion of the housing 321, and the top portion of the housing 321 is located between the stoppers P2 and the sensing unit 31 in the Z direction.

Similarly, when the movable part 322 is driven to move downwardly relative to the fixed part, the lower protrusion P3 extends through the hole 3231 of the base 323 and contacts the bottom plate (not shown) below the base 323. However, when the movable part 322 moves downwardly to another limit position relative to the fixed part, the stoppers P4 contact the base 323 to restrict the movable part 322 in the limit position, whereby the structural damages due to the impact between the lower protrusion P3 and the bottom plate can be prevented.

As shown in FIGS. 4 and 6, a magnet HM is disposed on the movable part 322 (FIG. 6), and a magnetic field sensor HS is disposed on the fixed part to detect the magnet HM, whereby the movement of the movable part 322 relative to the fixed part can be determined.

In some embodiments, the capacitive fingerprint sensor 3121 can be replaced by a pressure sensor or a piezo switch. When the pressure sensor detects a pressure exerted by an object exceeding a threshold, or when the piezo switch is activated by an object (e.g. the user's finger), the processor 332 on the circuit board 331 transmits a driving signal to the driving mechanism (e.g. the coil C), whereby the movable part 322 is driven to move relative to the fixed part and contacts the sensing unit 31.

Figure 7:
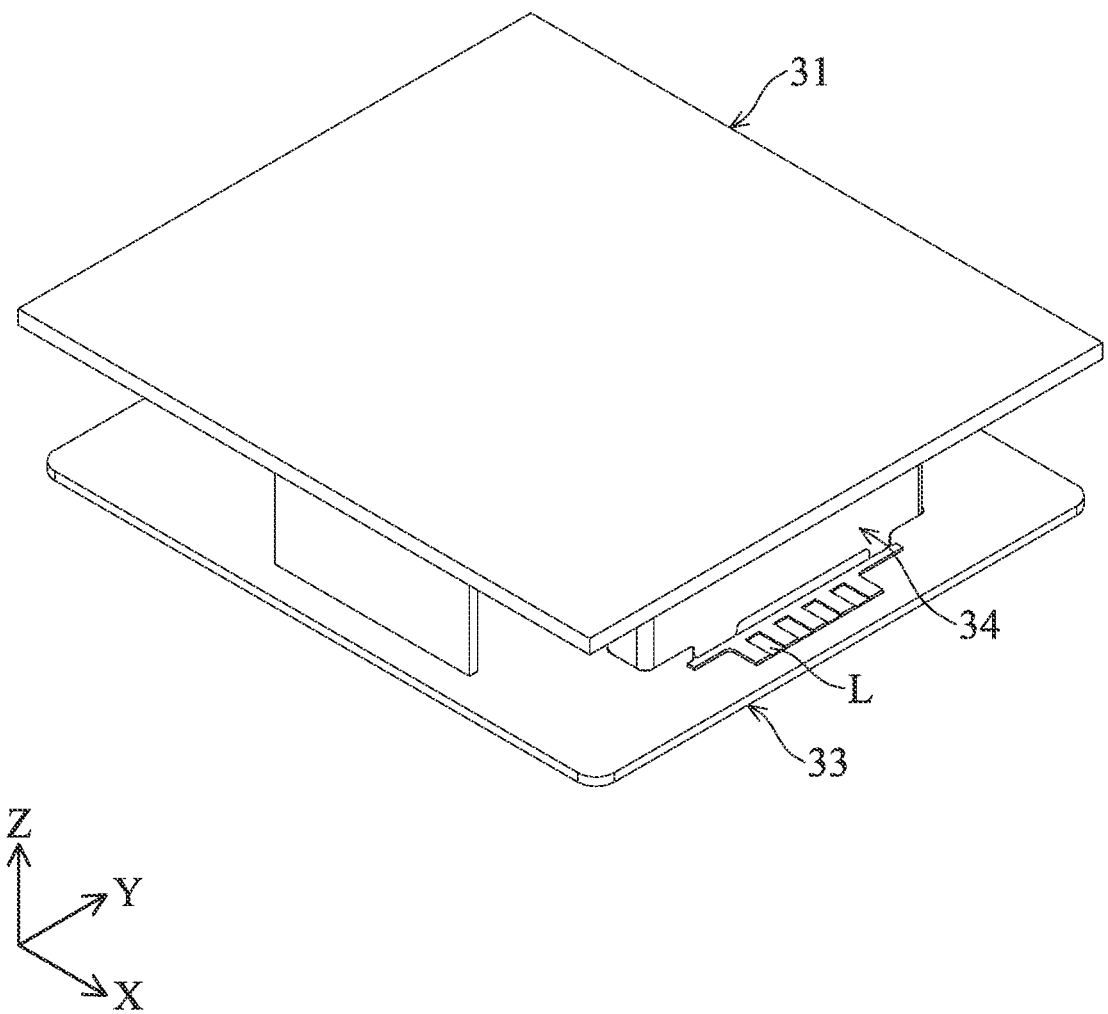
FIG. 7 is a perspective diagram of a haptic feedback system 30' in accordance with another embodiment of the invention.
Figure 8:
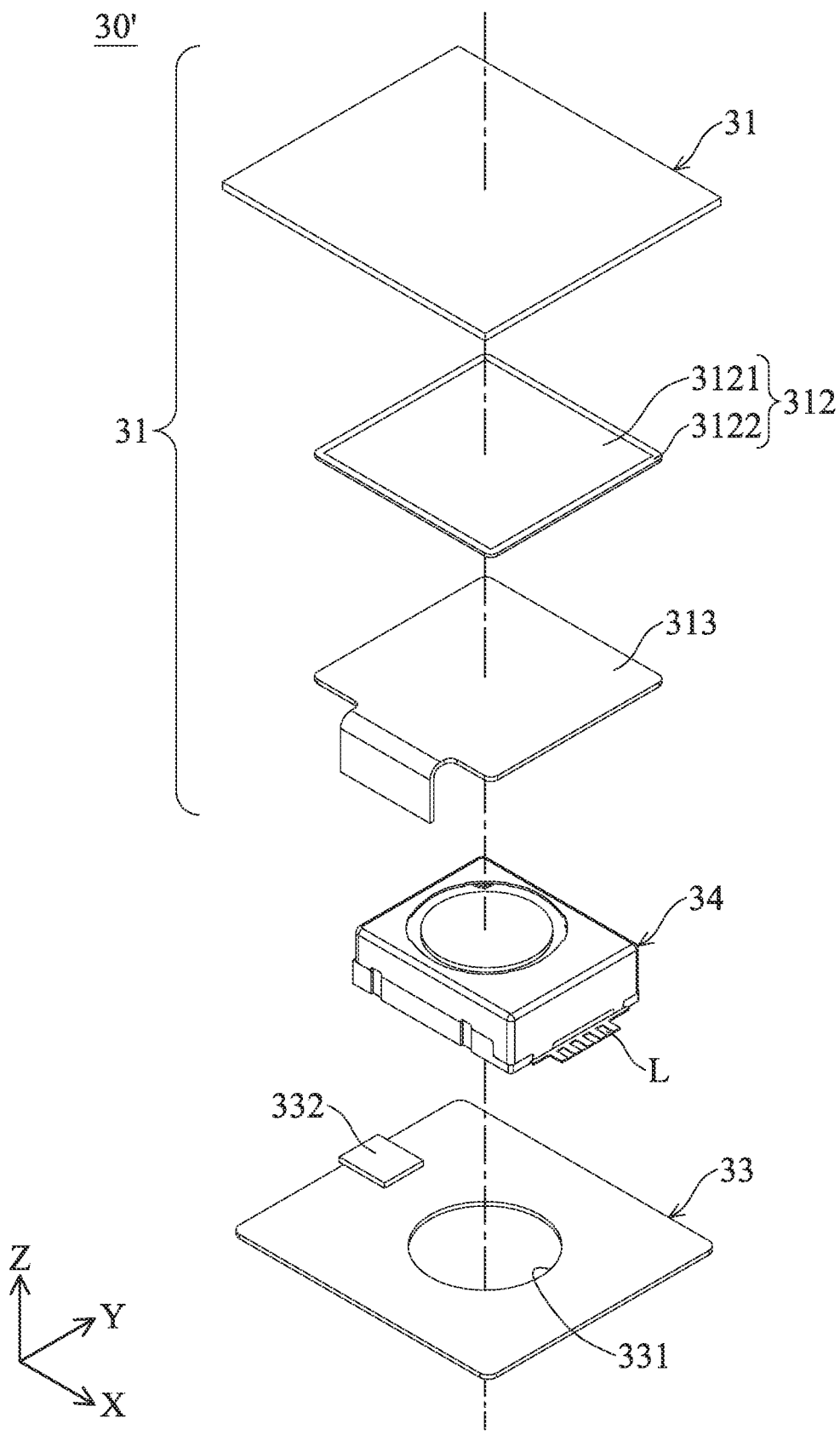
FIG. 8 is an exploded diagram of the haptic feedback system 30' in FIG. 8.
Figure 9:
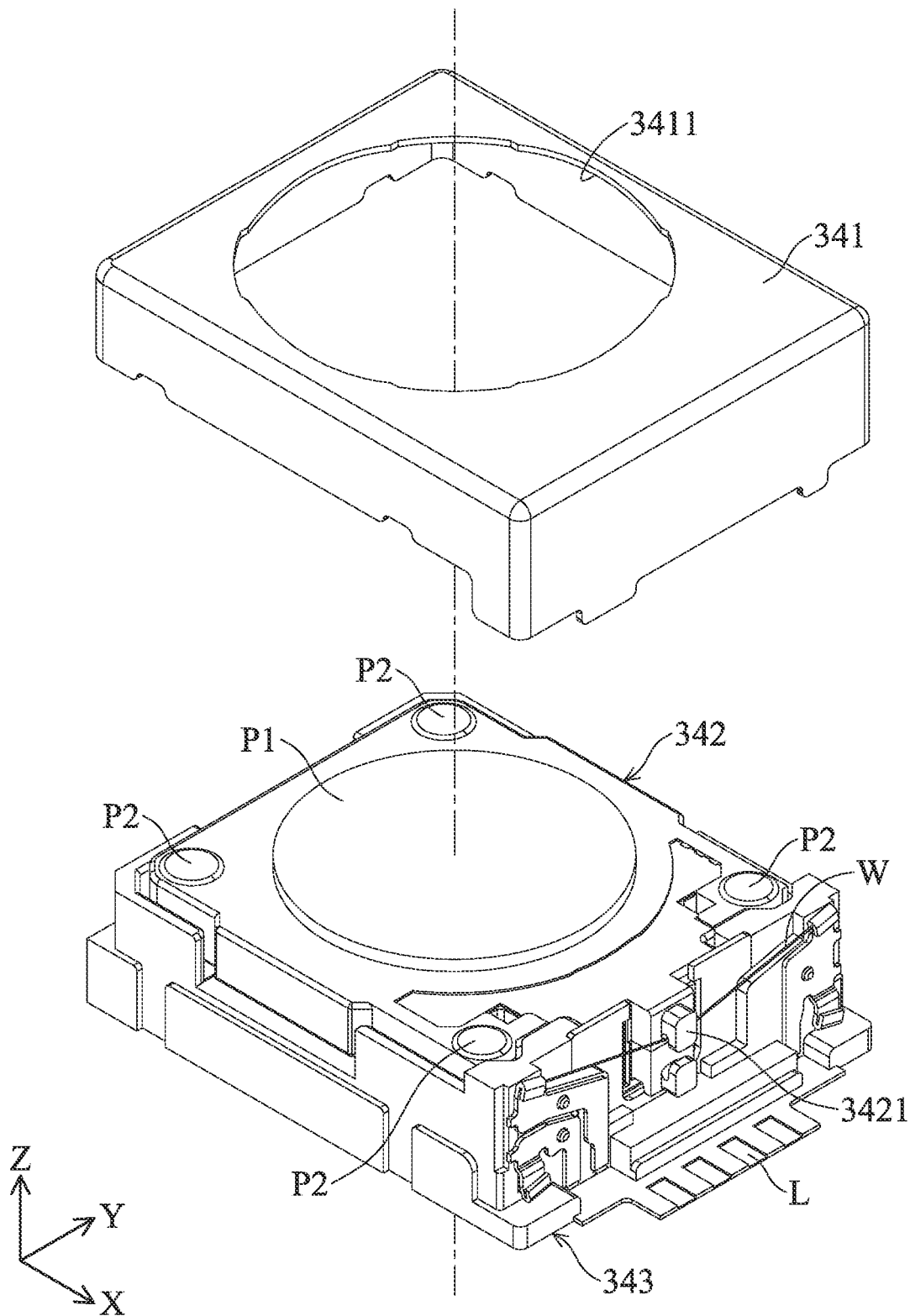
FIG. 9 is an exploded diagram of the haptic feedback module 34 in FIG. 8.
Figure 10:
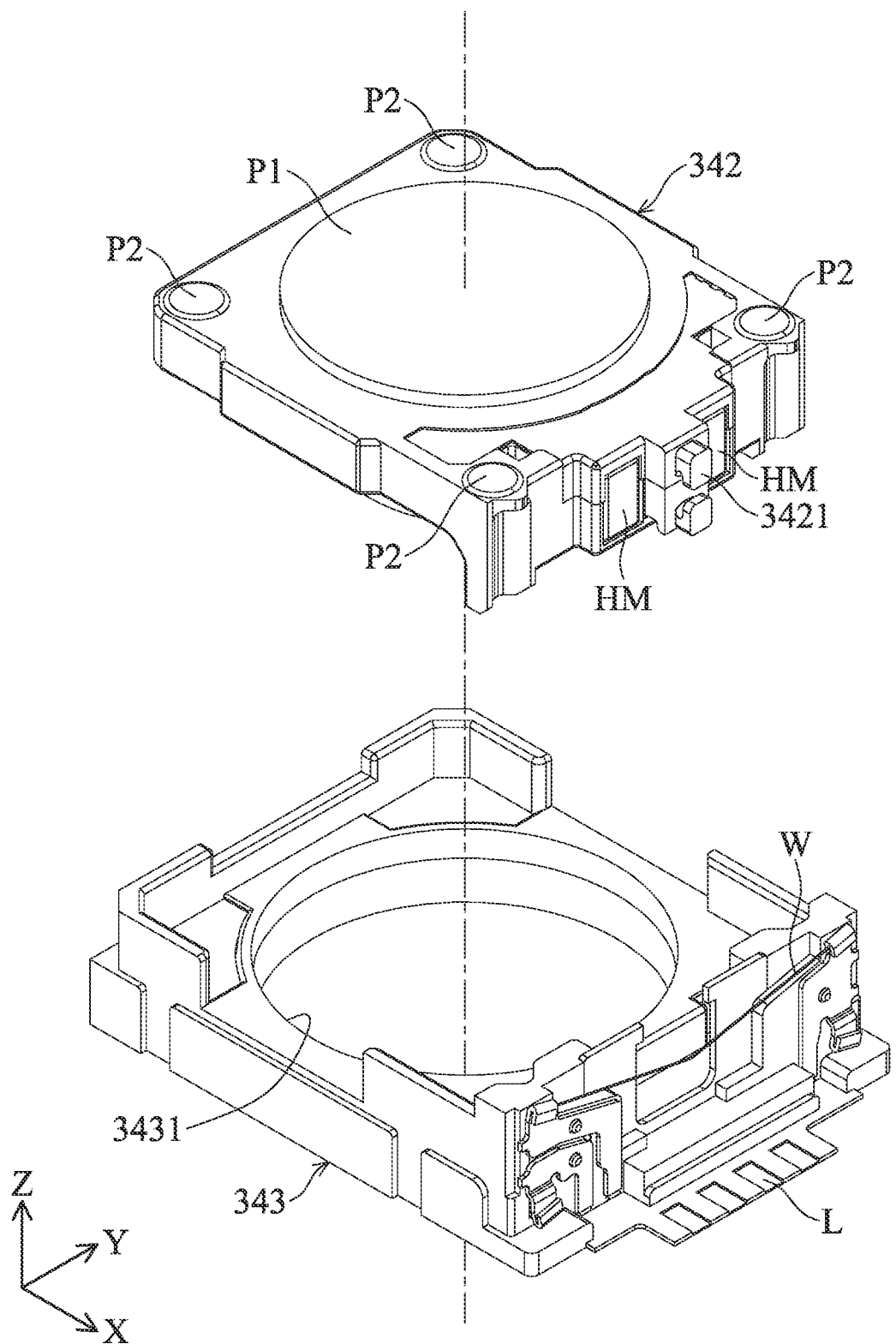
FIG. 10 is an exploded diagram of the movable part 342, the fixed part 343, and the shape memory alloy element W in FIG. 9.
Figure 11:
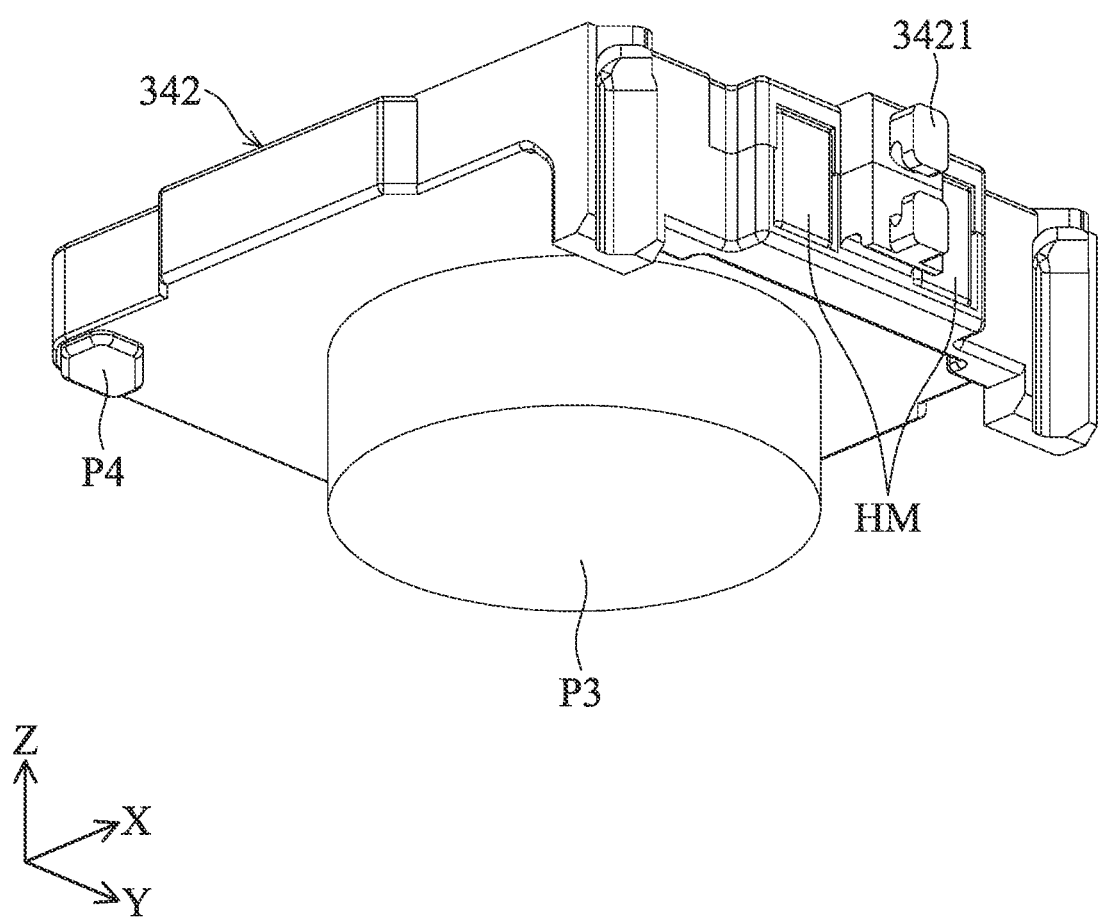
FIG. 11 is a perspective diagram of the movable part 342 in FIG. 10.

FIG. 7 is a perspective diagram of a haptic feedback system 30' in accordance with another embodiment of the invention. FIG. 8 is an exploded diagram of the haptic feedback system 30' in FIG. 8. FIG. 9 is an exploded diagram of the haptic feedback module 34 in FIG. 8. FIG. 10 is an exploded diagram of the movable part 342, the fixed part 343, and the shape memory alloy element W in FIG. 9. FIG. 11 is a perspective diagram of the movable part 342 in FIG. 10.

Referring to FIGS. 7-11, this embodiment is different from the haptic feedback system 30 of FIGS. 1-6 in that the haptic feedback system 30' comprises a haptic feedback module 34. The haptic feedback module 34 primarily comprises a housing 341, a movable part 342, and a base 343. The housing 341 and the base 343 are affixed to each other to constitute a fixed part of the haptic feedback module 34. The movable part 342 is received in a space between the housing 341 and the base 343, and the movable part 342 can slide relative to the base 343 along the Z axis.

Specifically, a shape memory alloy element W is connected between the movable part 342 and the base 343, and a hook 3421 is formed on a side of the movable part 342. The shape memory alloy element W extends through the hook 3421, so that the movable part 342 is suspended in the base 343.

In this embodiment, the shape memory alloy element W is electrically connected to the circuit board 331 via the conductive terminal L. When a current signal is applied to the shape memory alloy element W, the shape memory alloy element W (driving mechanism) can expand or contract to change its length, thus driving the movable part 342 to move relative to the base 343 along the Z axis.

As shown in FIGS. 7-11, an upper protrusion P1 and several stoppers P2 are formed on the top side of the movable part 342, and a lower protrusion P3 and several stoppers P4 are formed on the bottom side of the movable part 342.

When the movable part 342 is driven to move upwardly relative to the fixed part, the upper protrusion P1 extends through the opening 3411 of the housing 341 and contacts the circuit element 313 of the sensing unit 31. However, when the movable part 342 moves upwardly to a limit position relative to the fixed part, the stoppers P2 contact the top portion of the housing 321 to restrict the movable part 342 in the limit position, whereby the structural damages due to the impact between the upper protrusion P1 and the circuit element 313 can be prevented.

Similarly, when the movable part 342 is driven to move downwardly relative to the fixed part, the lower protrusion P3 extends through the hole 3431 of the base 343 and contacts the bottom plate (not shown) below the base 343. However, when the movable part 342 moves downwardly to another limit position relative to the fixed part, the stoppers P4 contact the base 343 to restrict the movable part 342 in the limit position, whereby the structural damages due to the impact between the lower protrusion P3 and the bottom plate can be prevented.

In FIGS. 10 and 11, a magnet HM is disposed on the movable part 342, and a magnetic field sensor (not shown) is disposed on the fixed part to detect the magnet HM, whereby the movement of the movable part 342 relative to the fixed part can be determined.

Figure 12:
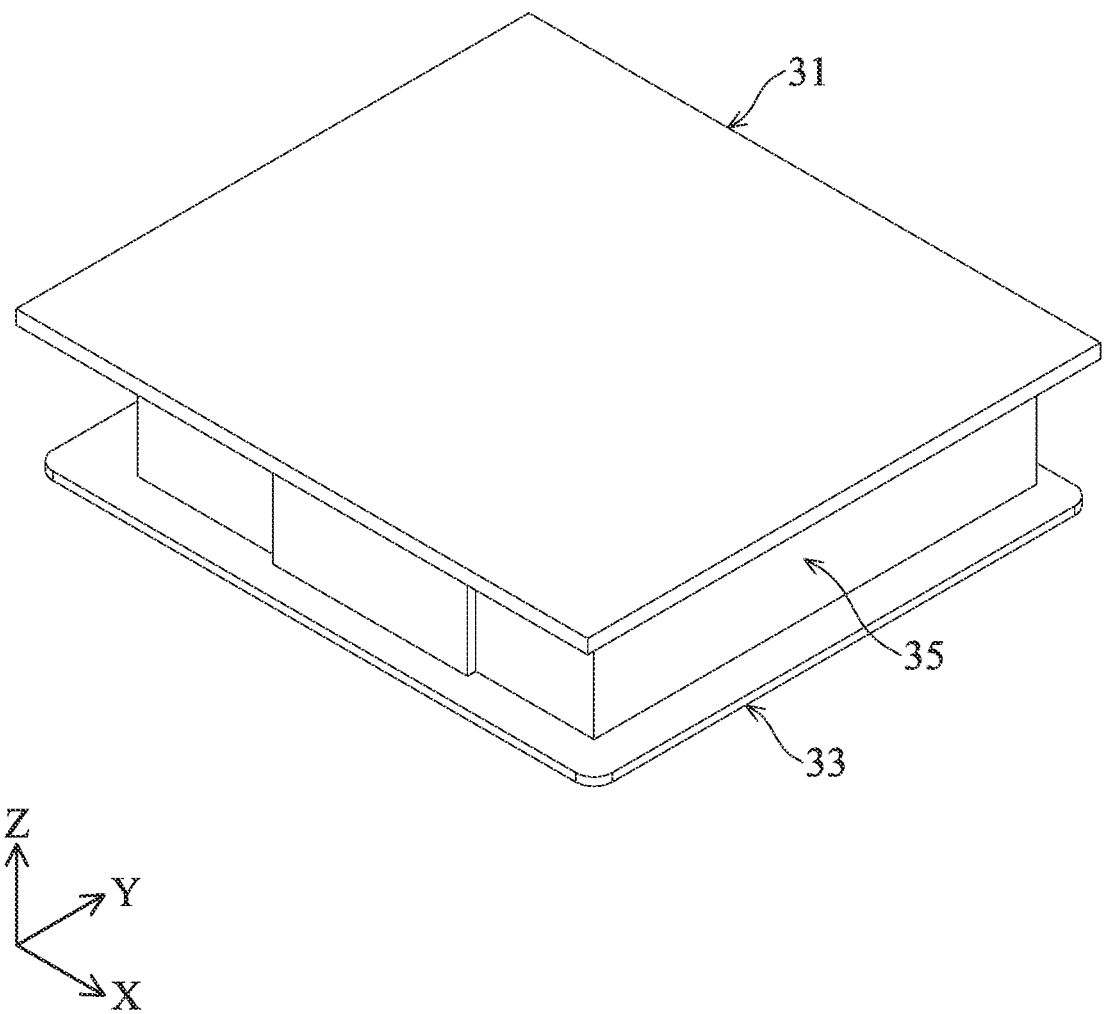
FIG. 12 is a perspective diagram of a haptic feedback system 30" in accordance with another embodiment of the invention.
Figure 13:
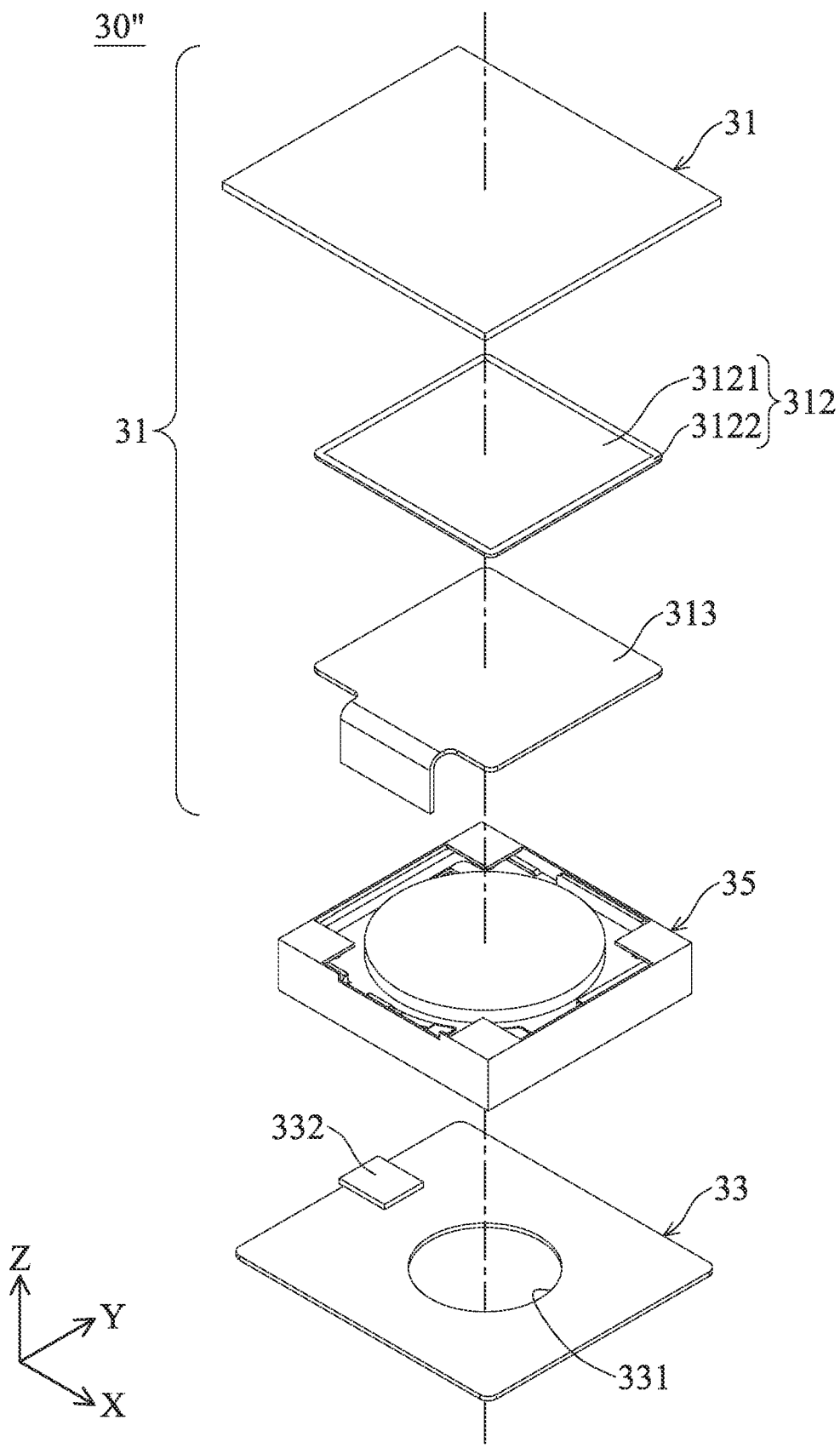
FIG. 13 is an exploded diagram of the haptic feedback system 30" in FIG. 12.
Figure 14:
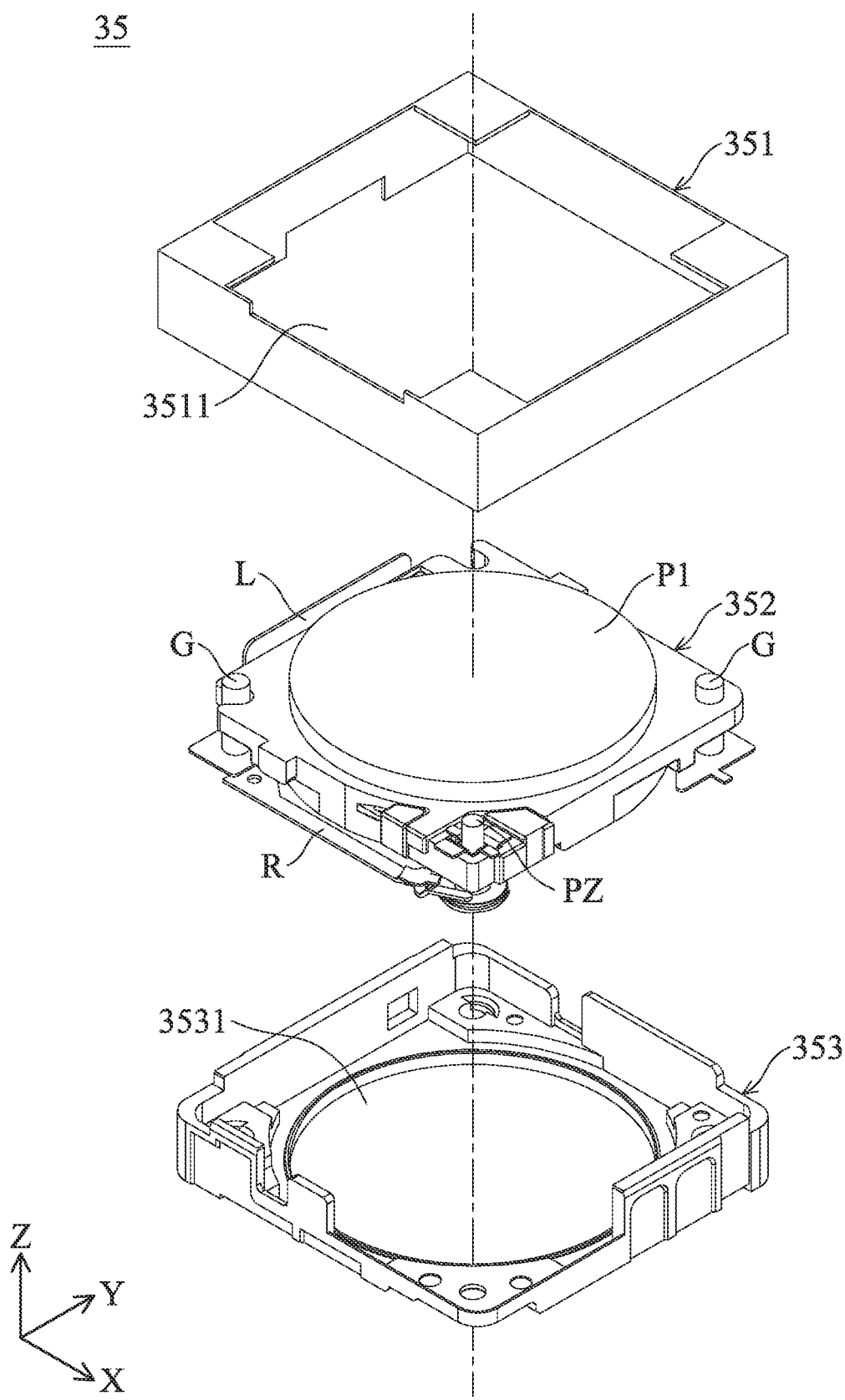
FIG. 14 is an exploded diagram of the haptic feedback module 35 in FIG. 13.

FIG. 12 is a perspective diagram of a haptic feedback system 30" in accordance with another embodiment of the invention. FIG. 13 is an exploded diagram of the haptic feedback system 30" in FIG. 12. FIG. 14 is an exploded diagram of the haptic feedback module 35 in FIG. 13. FIG.

Figure 16:
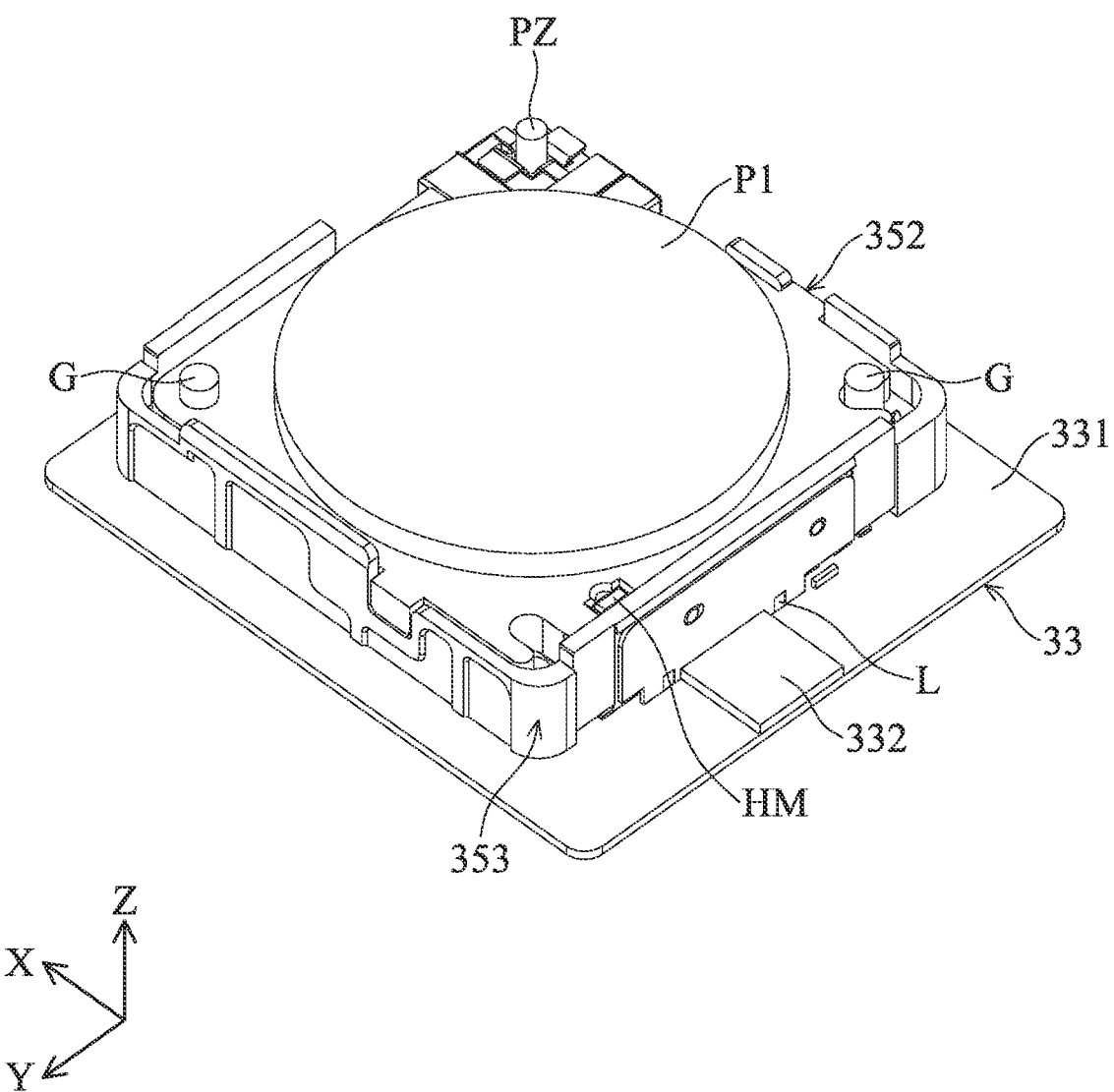
FIG. 16 is a perspective diagram of the piezoelectric element PZ electrically connected to the circuit board 331 via the conductive terminal L.

15 is a perspective diagram of the movable part 352, the piezoelectric element PZ, the guiding pins G, the metal member R, and the conductive terminal L in FIG. 14 after assembly. FIG. 16 is a perspective diagram of the piezoelectric element PZ electrically connected to the circuit board 331 via the conductive terminal L.

Referring to FIGS. 12-16, this embodiment is different from the haptic feedback system 30 of FIGS. 1-6 in that the haptic feedback system 30" comprises a haptic feedback module 35. The haptic feedback module 35 primarily comprises a housing 351, a movable part 352, and a base 353. The housing 351 and the base 353 are affixed to each other to constitute a fixed part of the haptic feedback module 35. The movable part 352 is received in a space between the housing 351 and the base 353, and the movable part 352 can slide relative to the base 353 along the Z axis.

Specifically, a piezoelectric element PZ and several guiding pins G extend through the movable part 352 and connects to the base 353. The guiding pins G are configured for guiding the movable part 352 to slide relative to the base 353 along the Z axis.

Moreover, a metal member R is disposed under the movable part 352 and electrically connected to the conductive terminal L. The piezoelectric element PZ can be electrically connected to the circuit board 331 via the metal member R and the conductive terminal L.

When a current signal is applied to the piezoelectric element PZ, the piezoelectric element PZ (driving mechanism) can expand or contract to change its length, thus driving the movable part 352 to move relative to the base 353 along the Z axis.

Figure 15:
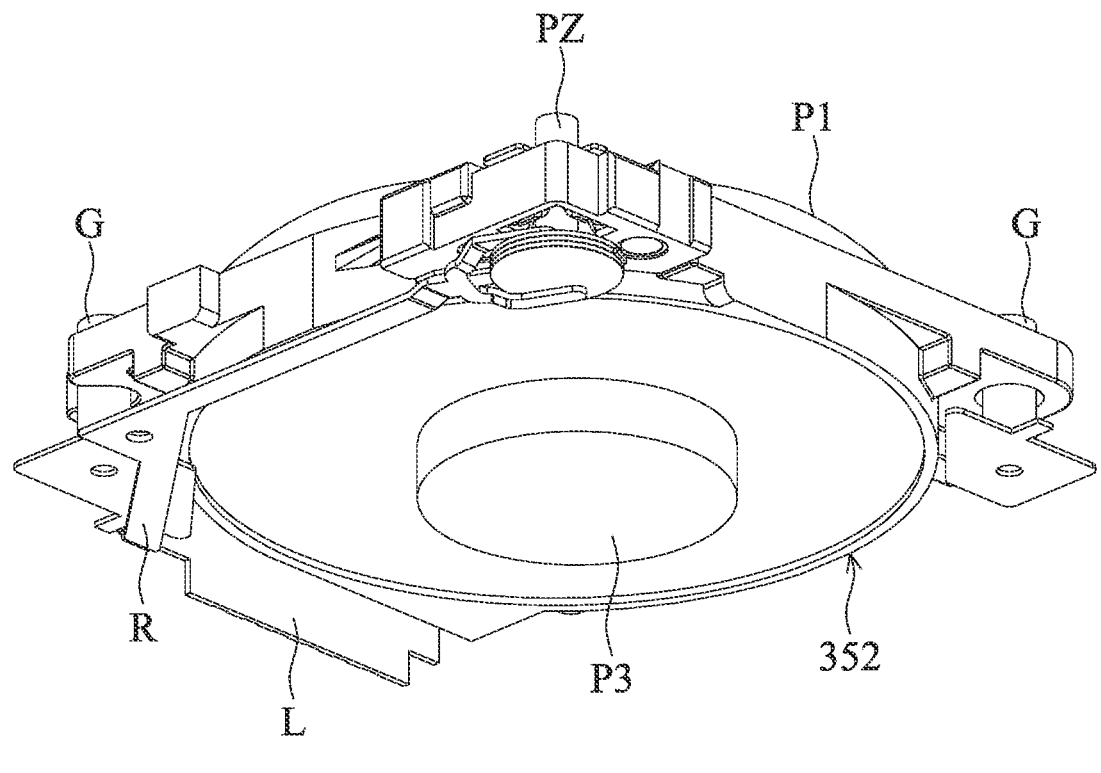
FIG. 15 is a perspective diagram of the movable part 352, the piezoelectric element PZ, the guiding pins G, the metal member R, and the conductive terminal L in FIG. 14 after assembly.
Figure 15:
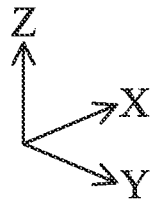

As shown in FIGS. 14-16, an upper protrusion P1 is formed on the top side of the movable part 352, and a lower protrusion P3 is formed on the bottom side of the movable part 352. When the movable part 352 is driven to move upwardly relative to the fixed part, the upper protrusion P1 extends through the opening 3511 of the housing 351 and contacts the circuit element 313 of the sensing unit 31, whereby a contact force can be transferred to the sensing unit 31 to perform haptic feedback.

Moreover, when the movable part 352 is driven to move downwardly relative to the fixed part, the lower protrusion P3 extends through the hole 3531 of the base 353 and contacts the bottom plate (not shown) below the base 353, whereby a vibration signal can be generated to enhance the haptic feedback effect.

In FIG. 16, a magnet HM is disposed on the movable part 352, and a magnetic field sensor (not shown) is disposed on the base 353 to detect the magnet HM, whereby the movement of the movable part 352 relative to the fixed part can be determined.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A haptic feedback system, comprising:
a sensing unit, configured to detect contact with an object;
a haptic feedback module, configured to transfer a contact force to the sensing unit; and
a circuit assembly, electrically connected to the sensing unit and the haptic feedback module,
wherein the haptic feedback module comprises a fixed part, a movable part movably connected to the fixed part, and a driving mechanism electrically connected to the circuit assembly for driving the movable part to move relative to the fixed part,
wherein the sensing unit transmits a sensing signal to the circuit assembly, and the circuit assembly transmits a driving signal to the driving mechanism according to the sensing signal, whereby the movable part is driven to move relative to the fixed part and contacts the sensing unit,
wherein the fixed part has an opening, and when the movable part is driven to move relative to the fixed part, the movable part extends through the opening and contacts the sensing unit,
wherein the fixed part comprises a housing and a base, the housing has a top portion and at least a sidewall connected to the top portion, the opening is formed on the top portion, the base is connected to the housing, and the movable part is disposed between the housing and the base, and
wherein the movable part has at least a stopper protruding toward the housing, and when the movable part moves relative to the fixed part to a limit position, the stopper contacts the top portion to restrict the movable part in the limit position.

2. The haptic feedback system as claimed in claim 1, wherein the top portion is located between the stopper and the sensing unit.

3. The haptic feedback system as claimed in claim 2, wherein the sensing unit is affixed to the top portion.

4. The haptic feedback system as claimed in claim 1, wherein the sensing unit has a pressure sensor, and when the pressure sensor detects that a pressure exerted by the object exceeds a threshold, the circuit assembly transmits the driving signal to the driving mechanism, whereby the movable part is driven to move relative to the fixed part and contacts the sensing unit.

5. The haptic feedback system as claimed in claim 1, wherein the sensing unit has a piezo switch, and when the piezo switch is activated by the object, the circuit assembly transmits the driving signal to the driving mechanism, whereby the movable part is driven to move relative to the fixed part and contacts the sensing unit.

6. The haptic feedback system as claimed in claim 1, wherein the sensing unit has a fingerprint sensor, and when a user's identity is confirmed by the fingerprint sensor detecting the object, the circuit assembly transmits the driving signal to the driving mechanism, whereby the movable part is driven to move relative to the fixed part and contacts the sensing unit.

7. The haptic feedback system as claimed in claim 6, wherein the fingerprint sensor is a capacitive fingerprint sensor.

8. The haptic feedback system as claimed in claim 1, wherein the movable part is driven by the driving mechanism to move relative to the fixed part and generates a vibration signal to the sensing unit.

9. The haptic feedback system as claimed in claim 1, wherein the movable part has an upper protrusion, and when the movable part is driven to move relative to the fixed part, the upper protrusion extends through the opening and contacts the sensing unit.

10. The haptic feedback system as claimed in claim 1, further comprising a bottom plate disposed below the circuit assembly, wherein the circuit assembly includes a circuit board and a processor disposed on the circuit board, and the circuit board has a hole, wherein the movable part extends through the hole and contacts the bottom plate when the movable part is driven to move relative to the fixed part.

11. The haptic feedback system as claimed in claim 10, wherein the movable part has a lower protrusion, and when the movable part is driven to move relative to the fixed part, the lower protrusion extends through the hole and contacts the bottom plate.

12. The haptic feedback system as claimed in claim 1, wherein the haptic feedback module further comprises a magnet and a magnetic field sensor, the magnet is disposed on the movable part, and the magnetic field sensor is disposed on the fixed part to detect the magnet.

13. The haptic feedback system as claimed in claim 1, wherein the driving mechanism comprises a piezoelectric element that is electrically connected to circuit assembly, and the movable part is movably connected to the fixed part via the piezoelectric element.

14. A haptic feedback system, comprising:
a sensing unit, configured to detect contact with an object;
a haptic feedback module, configured to transfer a contact force to the sensing unit; and
a circuit assembly, electrically connected to the sensing unit and the haptic feedback module,
wherein the haptic feedback module comprises a fixed part, a movable part, movably connected to the fixed part, and a driving mechanism electrically connected to the circuit assembly for driving the movable part to move relative to the fixed part,
wherein the sensing unit transmits a sensing signal to the circuit assembly, and the circuit assembly transmits a driving signal to the driving mechanism according to the sensing signal, whereby the movable part is driven to move relative to the fixed part and contacts the sensing unit, and
wherein the sensing unit includes a protective element, a sensing element, and a circuit element electrically connecting the sensing element to the circuit assembly, wherein the sensing element is disposed between the protective element and the circuit element.

15. A haptic feedback system, comprising:
a sensing unit, configured to detect contact with an object;
a haptic feedback module, configured to transfer a contact force to the sensing unit; and
a circuit assembly, electrically connected to the sensing unit and the haptic feedback module,
wherein the haptic feedback module comprises a fixed part, a movable part, movably connected to the fixed part, and a driving mechanism electrically connected to the circuit assembly for driving the movable part to move relative to the fixed part,
wherein the sensing unit transmits a sensing signal to the circuit assembly, and the circuit assembly transmits a driving signal to the driving mechanism according to the sensing signal, whereby the movable part is driven to move relative to the fixed part and contacts the sensing unit, and
wherein the driving mechanism comprises a shape memory alloy element that is electrically connected to the circuit assembly, and the movable part is movably connected to the fixed part via the shape memory alloy element.

16. The haptic feedback system as claimed in claim 15, wherein the movable part has a hook, and the shape memory alloy element extends through the hook.

17. The haptic feedback system as claimed in claim 13, wherein the piezoelectric element extends through the movable part.

* * * * *